United States Patent [19]

Francis et al.

[11] Patent Number: 4,906,514
[45] Date of Patent: Mar. 6, 1990

[54] METALLIZED SUBSTRATE FOR ELECTRONIC DEVICE

[75] Inventors: Gaylord L. Francis; Francis W. Martin, both of Painted Post, N.Y.

[73] Assignee: Corning Incorporated, Corning, N.Y.

[21] Appl. No.: 273,586

[22] Filed: Nov. 21, 1988

[51] Int. Cl.$^4$ ............................................... B32B 9/00
[52] U.S. Cl. .................................... 428/209; 428/210; 428/323; 428/328; 428/426; 428/432; 428/433; 428/698; 428/901; 174/256; 361/397; 106/1.12; 106/1.16
[58] Field of Search ............... 428/209, 210, 426, 432, 428/433, 698, 901, 323, 328; 174/68.5; 361/397; 106/1.12–1.16

[56] References Cited

U.S. PATENT DOCUMENTS

| Re. 30,313 | 6/1980 | Carcia | 252/520 |
| 4,381,469 | 4/1983 | Ogawa et al. | 310/346 |
| 4,671,928 | 6/1987 | Herron et al. | 264/125 |

Primary Examiner—Patrick Ryan
Attorney, Agent, or Firm—Clinton S. Janes, Jr.; Milton M. Peterson

[57] ABSTRACT

Metallizing pastes, for forming thick film circuitry on low expansion substrates in electronic devices, are disclosed. The paste contains a glass powder that crystallizes on firing to a glass-ceramic in which lead titanate is the primary crystal phase.

16 Claims, 1 Drawing Sheet

METALLIZED SUBSTRATE FOR ELECTRONIC DEVICE

FIELD OF THE INVENTION

This invention is concerned with electroconductive circuitry on a low expansion substrate in an electronic device. It is particularly concerned with a metal paste that is compatible when fired on the substrate to form the circuitry.

BACKGROUND OF THE INVENTION

Alumina ($Al_2O_3$) has been a favored ceramic substrate material for electronic circuitry where long life and high reliability are required. However, for certain high performance applications, sintered alumina substrates have proven less than satisfactory.

While an alumina body can be ground to a smooth finish, it undergoes high shrinkage (about 18%) on firing. Sintered alumina has a relatively high dielectric constant of about 10, which restricts line spacing and may lead to signal delays and noise in operation. A relatively high coefficient of thermal expansion (about $65 \times 10^{-7}/°C.$), as compared to that of silicon chips (about $35 \times 10^{-7}/°C.$), can make it difficult to seal such chips to an alumina substrate. Finally, high firing temperatures (about 1600° C.) are required for co-sintering. This limits the metals that may be employed to molybdenum and tungsten, and excludes silver, copper and gold.

Accordingly, a search has been made for substrate materials having more compatible properties than sintered alumina. In particular, materials having coefficients of thermal expansion more closely matched to silicon, and a lower dielectric constant than alumina, have been sought.

Glass-ceramic materials, in particular the cordierite-type, have received considerable attention. Some of the history is reviewed in co-pending application Ser. No. 07/238,574 filed Aug. 31, 1988, and assigned to the assignee of this application. This co-pending application discloses modified cordierite compositions that have superior properties to those of alumina, and that can be sintered below 1000° C. The latter property permits co-sintering, that is, firing metal circuitry and sintering the substrate in one heat treatment.

Aluminum nitride (AlN) is another ceramic material that holds considerable promise as a substrate material. In addition to a compatible coefficient of thermal expansion, this material has an exceptionally high thermal conductivity. This permits dissipation of heat from soldering and sealing operations that might otherwise damage the circuitry. U.S. Pat. No. 4,719,187 (Bardhan et al.) describes AlN and an improved method for its production.

The advent of these lower expansion substrate materials has necessitated development of new metallizing pastes, particularly for application of thick film circuitry to presintered substrates. In general, electroconductive metals can be applied as thin films where interior circuitry is involved, or where the circuitry and a "green" substrate are to be co-sintered.

The term "thin film" refers to a suspension of metal powder in a vehicle without any additive. In contrast, the term "thick film" refers to a suspension of metal powder containing a vitreous additive. The latter provides adhesion to the substrate when the paste is fired. The present invention is concerned with thick film pastes containing a vitreous additive. Prior commercial metal pastes, such as palladium-silver (Pd-Ag) and copper pastes, contained additives adapted to seal to alumina substrates. It has been found that these pastes do not adhere well when fired on the new lower expansion materials.

PURPOSES OF THE INVENTION

A basic purpose of the invention is to provide a metallizing paste that adheres well when fired on a low expansion substrate material, such as a cordierite-type glass-ceramic or aluminum nitride.

A further purpose is to provide an electronic device having thick film circuitry on a cordierite-type glass-ceramic or aluminum nitride substrate.

Another purpose is to provide an electronic device having thick film circuitry on a substrate compatible with silicon semiconductor chips.

SUMMARY OF THE INVENTION

One aspect of the invention is an electronic component comprising a ceramic substrate composed of a cordierite-type glass-ceramic or aluminum nitride and thick film circuitry on the substrate surface, the film being composed essentially of electroconductive metal powder dispersed in a glass-ceramic matrix, the matrix containing lead titanate as its primary crystal phase whereby the coefficient of thermal expansion of the circuitry matches that of the substrate. The metal powder may be any electroconductive metal, such as copper, a noble metal such as gold or silver, or a conventional Pd-Ag mixture. It may constitute 82–98.5% of the film, preferably about 90%. The lead titanate glass-ceramic may be composed of 60–80% PbO, at least 1% $B_2O_3$, at least 5% $SiO_2$, the $B_2O_3 + SiO_2$ being 10–20%, 5–18% $TiO_2$, up to 20% of a divalent oxide selected from the group composed of ZnO and BaO, and 0–2% $Al_2O_3$.

Another aspect of the invention resides in the metallizing paste applied to form the circuitry. The paste is composed of 82–98.5% of any electroconductive metal, such as copper, a noble metal such as gold or silver, or a conventional Pd-Ag mixture, mixed with 1.5–18% of a glass powder having a composition in a lead-zinc-titanium-borosilicate family, or in a lead-barium-titanium-borosilicate family. The glass is capable of being thermally crystallized in situ to provide a lead titanate primary crystal phase, the mixed powders being dispersed in a temporary organic vehicle.

PRIOR LITERATURE

In addition to references cited in the Background section, the following may be of interest.

U.S. Pat. No. 3,405,002 (Martin) discloses a thermally devitrifiable sealing glass, comprising 60–80% PbO, 18–25% $TiO_2$ and 6–12% $SiO_2$, which is adapted to glazing low expansion bodies such as borosilicate glass articles, and produces a lead titanate crystal phase when thermally devitrified. There is no disclosure of metal pastes or metallized electronic devices.

U.S. Pat. No. 3,486,871 (Martin) discloses thermally devitrifiable sealing glasses comprising 60–80% PbO, up to 20% of a divalent oxide selected from the group consisting of ZnO and BaO, from 5–18% $TiO_2$, at least 1% $B_2O_3$, at least 5% $SiO_2$, the $B_2O_3 + SiO_2$ being 10–20% and 0–2% $Al_2O_3$. The thermally devitrified glass has a lead titanate crystal phase. Again there is no disclosure of metal pastes or metallized articles.

U.S. Pat. No. 3,663,244 (Martin) discloses thermally devitrifiable glass enamels having high chemical durability, low coefficient of thermal expansion, useful on glass-ceramic cookware, and composed essentially of 62–68% PbO, 12–16% $TiO_2$, 14–20% $SiO_2$ and 2–4% $Al_2O_3$.

U.S. Pat. No. 4,015,048 (Martin) discloses MgO-$Al_2O_3$-$SiO_2$ glasses that contain an additional divalent oxide and that yield a hexagonal cordierite crystal phase on thermal devitrification. Use as electrical barrier layers on glass-ceramic articles is disclosed.

U.S. Pat. No. 4,029,605 (Kosiorek) discloses metallizing compositions which include 50–88% of a noble metal powder, 2–40% of a $Li_2O$-$Al_2O_3$-$B_2O_3$-$SiO_2$ crystallizable glass frit with a $ZrO_2$ or $TiO_2$ nucleating agent, 5–48% liquid vehicle and 0–20% of inert filler.

U.S. Pat. Nos. 4,221,047 (Narken et al.) and 4,301,324 (Kumar et al.) disclose multilevel glass-ceramic structures wherein alternating layers of glass-ceramic and thick film circuit patterns are formed and integrated into a monolithic package. Beta-spodumene and cordierite glass-ceramics that sinter below 1000° C. are employed. Metallizing pastes of gold, silver or copper are used, but not further described.

SPECIFIC DESCRIPTION OF THE INVENTION

Figure 1:
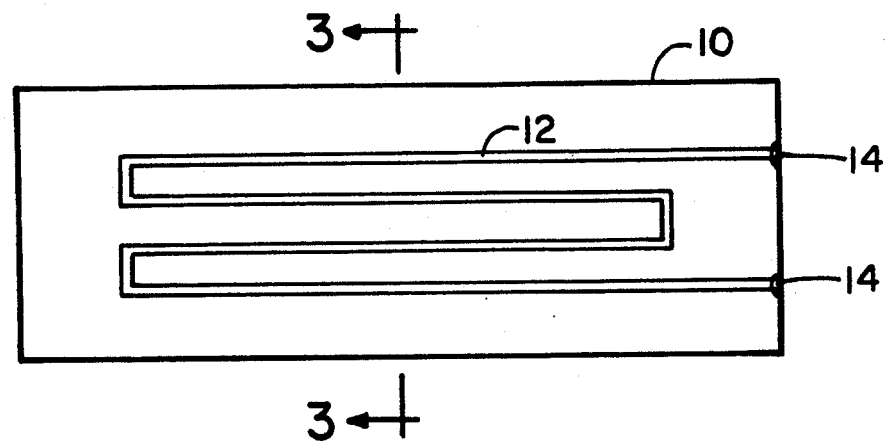
FIG. 1 is a top plan view of a simple circuit board in accordance with the invention.
Figure 2:
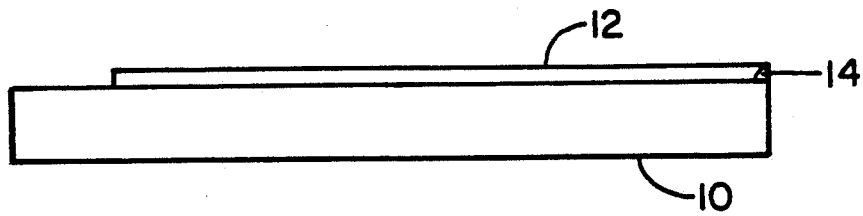
FIG. 2 is a side elevational view of FIG. 1.
Figure 3:
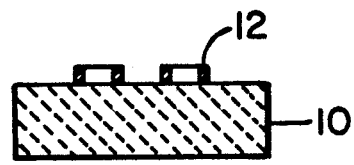
FIG. 3 is a cross-section view along line 3—3 of FIG. 1.

The circuit board shown in FIGS. 1, 2 and 3 includes a presintered substrate 10 having thick film circuitry 12 fired on the upper surface of the board and extending between contacts 14.

Substrate 10 may be composed of aluminum nitride, a material of particular value because of its low coefficient of thermal expansion (near $30 \times 10^{-7}$/°C.) and its relatively high thermal conductivity. Alternatively, the substrate may be composed of a cordierite type glass-ceramic, also having a low expansion coefficient, that may be near 30, and a low dielectric constant near 5.

Circuitry 12 is applied as a metallizing paste in conventional manner. Metallizing pastes are prepared by reducing both an electroconductive metal and a glass frit to a finely divided state, e.g. passing a 325 mesh screen. The finely divided materials may then be blended together with a vehicle and passed through a mill. This provides a homogeneous paste having a viscosity suitable for application on a substrate surface. The organic vehicle is one that readily evaporates or burns off during the firing cycle.

Commercial metallizing pastes, formulated for alumina substrates, were unsatisfactory when used on the new lower expansion substrates. Such pastes failed to adhere to aluminum nitride when fired. On cordierite-type glass-cerramics, adherence was mediocre, and there was a tendency for the fired paste to peel when thermally cycled.

In studying alternative frit glasses, it was discovered that only glasses with high lead oxide contents tended to wet aluminum nitride. However, these glasses generally have relatively high coefficients of thermal expansion, and hence are not capable of sealing with a low expansion substrate.

It was discovered, however, that certain PbO-ZnO-$TiO_2$-$B_2O_3$-$SiO_2$ glasses provided good wetting of a substrate as well as good ultimate adhesion. These glasses crystallize to form glass-ceramics with a primary crystal phase of lead titanate. It is believed that, as such a glass powder is heated, crystallization is sufficiently delayed to permit the glass to soften and wet the substrate well before crystallization again stiffens the glass. The crystallized glass-ceramic has a much lower coefficient of thermal expansion than the parent glass, whereby the coefficient of thermal expansion of the substrate may be more closely matched.

Preparation of the present metallizing paste follows traditional procedures. Thus, a selected electroconductive metal, e.g. copper, silver, gold, or a Pd-Ag mixture, is reduced to a fine powder. A glass frit, selected from the family just described, is also pulverized. The two powders, in predetermined proportions, are then mixed with an organic vehicle and homogenized, e.g. by passing through a three roller mill. A solution of ethyl cellulose in terpene alcohol is a preferred vehicle because of a high boiling point and low vapor pressure. These features tend to cause retention of the vehicle during paste application, and thus facilitate the process. Normally, the vehicle may be from 10 to 25% by weight of the glass-metal mix.

The mixture of metal and glass powders should consist of 82–98.5% metal powder and 18–1.5% glass powder. With less than 82% metal, resistance in the fired circuitry becomes too high. Also, a glassy surface interferes with solderability. However, at least 1.5% glass is required to provide adherence, and about 10% is preferred. For good solderability, either a Pd-Ag mixture or copper is customarily employed. If high electroconductivity is more important, either gold or copper is preferred.

Glass frits capable of in situ crystallization to form a primary crystal phase of lead titanate are taught in U.S. Pat. No. 3,486,871. The composition family there disclosed consists essentially of 60–80% PbO, at least 1% $B_2O_3$, at least 5% $SiO_2$, the $B_2O_3 + SiO_2$ being 10–20%, up to 20% of a divalent oxide selected from the group consisting of ZnO and BaO, and 0–2% $Al_2O_3$. A preferred glass frit composition consists of, in percent by weight as calculated from the batch on an oxide basis, 63% PbO, 10% ZnO, 7% $B_2O_3$, 7% $SiO_2$, 1% $Al_2O_3$ and 12% $TiO_2$.

SPECIFIC EMBODIMENTS

A series of conductor inks was prepared by blending weighed amounts of powdered metal and powdered glass frit with a screening medium. The metal materials employed were spherical copper particles approximately 2 microns in diameter, and a commercial Pd-Ag mix in which the particles averaged about 2.5 microns in diameter. The screening medium in each case was six (6) percent by weight of ethyl cellulose dissolved in an alcohol solvent available from Eastman Chemical Corp. under the mark Texanol.

Each metal, glass frit and screening medium combination was blended into a paste which was homogenized in a three-roll mill for about five minutes. The paste was screened through a 325 mesh screen, then applied to a substrate and fired. The substrate was a sintered strip of either aluminum nitride (AlN), or a cordierite-type glass-ceramic having the following composition, in calculated weight percent: 51.0% $SiO_2$, 24.8% $Al_2O_3$, 13.1% MgO, 3.1% BaO, 1.4% $B_2O_3$ and 6.6% ZnO.

The pastes were applied as 0.080"×0.080" pads for test purposes. Each test piece was fired in an infra-red lehr for about a half hour with a belt speed of 2"/minute and a peak temperature of 850° C. The Pd-Ag samples were fired in air, while the copper samples were fired in a nitrogen atomosphere containing 15 ppm oxygen.

Three different glass frits were employed. Each is capable of thermal crystallization to produce a lead titanate crystal phase. The frit compositions, as calculated in weight percent on an oxide basis, are set forth in TABLE I:

TABLE 1

|  | 1 | 2 | 3 |
|---|---|---|---|
| $SiO_2$ | 7.0 | 7.55 | 12.5 |
| PbO | 63.0 | 67.9 | 65.9 |
| $B_2O_3$ | 7.0 | 7.6 | 1.6 |
| ZnO | 10.0 | 4.95 | 0.0 |
| $TiO_2$ | 12.0 | 12.0 | 18.0 |
| $Al_2O_3$ | 1.0 | 0.0 | 0.0 |

These glass frits were mixed in varying proportions with either copper or Pd-Ag powders and a screening medium to form metallizing pastes. Seven (7) mixtures were prepared having proportions in parts by weight as set forth in TABLE 2 below.

TABLE 2

|  | A | B | C | D | E | F | G |
|---|---|---|---|---|---|---|---|
| Copper | 30 | 30 | 30 | 30 | 30 | — | — |
| Pd—Ag | — | — | — | — | — | 30 | 30 |
| FRIT 1 | 6 | 9 | 3 | — | — | 3 | — |
| FRIT 2 | — | — | — | 6 | — | — | 3 |
| FRIT 3 | — | — | — | — | 6 | — | — |
| VEHICLE | 6 | 6 | 6 | 6 | 6 | 6 | 6 |

Each paste mixture was applied to both an AlN and a cordierite substrate to form pads on the substrate. The pads were then fired to form adherent metallized pads to which twenty gauge copper wires were clipped parallel to the substrate and across the center of the pad. Each wire-pad combination was then fluxed and immersed in a 60% tin-40% lead solder at 220° C.

The soldered wire leads were then cycled ten times between 125° C. to −55° C., each cycle taking about 90 minutes. Each wire lead was then bent at 90° to the substrate at a point 0.050" from the metallized pad. The lead was then pulled on an Instron Model TMS instrument at 0.5 cm./minute.

The average force in lbs. required to peel off the wire on each substrate is shown in TABLE 3. The data are an average of at least five pull tests.

TABLE 3

| COMPOSITION | SUBSTRATE | |
|---|---|---|
|  | AlN | Cordierite |
| A | 4.3 | 4.3 |
| B | 3.8 | 3.0 |
| C | 5.2 | 3.9 |
| D | 2.6 | 3.9 |
| E | 1.0 | 2.6 |
| F | 4.2 | 3.4 |
| G | 4.0 | 1.0 |

Other frit systems tested provided peel test values less than three lbs.

We claim:

1. An electrical component comprising a ceramic substrate, the ceramic being selected from the group composed of a modified cordierite composition glass-ceramic and aluminum nitride, and thick film circuitry on the substrate surface, the film being composed essentially of 82-98.5% of an electroconductive metal dispersed as a powder in a glass-ceramic matrix, the matrix containing lead titanate as its primary crystal phase whereby the coefficient of thermal expansion of the circuitry matches that of the substrate.

2. An electrical component in accordance with claim 1 wherein the substrate is composed of aluminum nitride.

3. An electrical component in accordance with claim 1 wherein the substrate is a modified cordierite composition glass-ceramic.

4. An electrical component in accordance with claim 1 wherein the electroconductive metal is a palladium-silver mixture.

5. An electrical component in accordance with claim 1 wherein the electroconductive metal is copper.

6. An electrical component in accordance with claim 1 wherein the electroconductive metal content is about 90%.

7. An electrical component in accordance with claim 1 wherein the glass-ceramic matrix is composed essentially of, in percent by weight as calculated on an oxide basis from the glass batch, 60-80% PbO, at least 1% $B_2O_3$, at least 5% $SiO_2$, the $B_2O_3 + SiO_2$ being 10-20%, up to 20% of a divalent metal oxide selected from the group consisting of ZnO and BaO, and 0-2% $Al_2O_3$.

8. An electrical component in accordance with claim 7 wherein the selected divalent metal oxide is ZnO.

9. An electrical component in accordance with claim 7 wherein the glass-ceramic matrix is composed of 63% PbO, 10% ZnO, 7% $B_2O_3$, 7% $SiO_2$, 12% $TiO_2$ and 1% $Al_2O_3$.

10. A metallizing paste composed of 82-98.5% of an electroconductive metal powder selected from the group composed of copper, a Pd-Ag mixture, and a noble metal mixed with 18-1.5% of a glass powder having a composition selected from the group composed of a lead-zinc-titanium-borosilicate family and a lead-barium-titanium-borosilicate family, the glass powder being capable of being thermally crystallized in situ to provide a lead titanate primary crystal phase, the mixed powders being blended into a temporary organic vehicle.

11. A metallizing paste in accordance with claim 10 wherein the metal powder is a Pd-Ag mixture.

12. A metallizing paste in accordance with claim 10 wherein the metal powder is copper.

13. A metallizing paste in accordance with claim 10 wherein the glass powder is about 10% of the metal-glass mixture.

14. A metallizing paste in accordance with claim 10 wherein the glass is composed essentially of, in percent by weight as calculated on an oxide basis from the batch, 60-80% PbO, at least 1% $B_2O_3$, at least 5% $SiO_2$, the $B_2O_3 + SiO_2$ being 10-20%, 5-18% $TiO_2$, up to 20% of the divalent metal oxide selected from the group consisting of ZnO and BaO, and 0-2% $Al_2O_3$.

15. A metallizing paste in accordance with claim 14 wherein the selected divalent metal oxide is ZnO.

16. A metallizing paste in accordance with claim 14 wherein the glass is composed of 63% PbO, 10% ZnO, 7% $B_2O_3$, 7% $SiO_2$, 12% $TiO_2$ and 1% $Al_2O_3$.

* * * * *